United States Patent
Hamashita

(10) Patent No.: US 12,557,517 B2
(45) Date of Patent: Feb. 17, 2026

(54) DISPLAY DEVICE AND ELECTRONIC DEVICE

(71) Applicant: SONY SEMICONDUCTOR SOLUTIONS CORPORATION, Kanagawa (JP)

(72) Inventor: Daisuke Hamashita, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 404 days.

(21) Appl. No.: 18/042,744

(22) PCT Filed: Sep. 8, 2021

(86) PCT No.: PCT/JP2021/033015
§ 371 (c)(1),
(2) Date: Feb. 23, 2023

(87) PCT Pub. No.: WO2022/054831
PCT Pub. Date: Mar. 17, 2022

(65) Prior Publication Data
US 2024/0032392 A1    Jan. 25, 2024

(30) Foreign Application Priority Data
Sep. 10, 2020  (JP) .................. 2020-152318

(51) Int. Cl.
*H10K 59/38*    (2023.01)
*H10K 59/122*   (2023.01)
*H10K 59/80*    (2023.01)

(52) U.S. Cl.
CPC .......... *H10K 59/38* (2023.02); *H10K 59/122* (2023.02); *H10K 59/873* (2023.02); *H10K 59/879* (2023.02)

(58) Field of Classification Search
CPC .... H10K 59/38; H10K 59/122; H10K 59/873; H10K 59/879; H10K 59/1201;
(Continued)

(56) References Cited

U.S. PATENT DOCUMENTS

| | | | |
|---|---|---|---|
| 2018/0061894 A1* | 3/2018 | Kim | H10K 59/351 |
| 2021/0066665 A1* | 3/2021 | Kwon | H10K 50/86 |
| 2021/0151484 A1* | 5/2021 | Moriya | H10F 39/806 |

FOREIGN PATENT DOCUMENTS

| | | |
|---|---|---|
| JP | 08-029612 A | 2/1996 |
| JP | 2006-073219 A | 3/2006 |

(Continued)

OTHER PUBLICATIONS

International Search Report and Written Opinion of PCT Application No. PCT/JP2021/033015, issued on Nov. 22, 2021, 08 pages of ISRWO.

*Primary Examiner* — Kevin Quarterman
(74) *Attorney, Agent, or Firm* — CHIP LAW GROUP

(57) ABSTRACT

Provided is a display device and an electronic device that can suppress mixing of light and mixing of colors with efficient light extraction. The display device includes a plurality of light-emitting elements having an organic layer, a plurality of color filters disposed at positions corresponding to the respective light-emitting elements, and a protective layer covering the side portions of the plurality of color filters. At a position between the adjacent color filters, a cavity portion is formed in the protective layer.

14 Claims, 17 Drawing Sheets

(58) Field of Classification Search
CPC ......... H10K 59/353; G09F 9/30; G09F 9/302;
H05B 33/02; H05B 33/12; G02B 5/20
See application file for complete search history.

(56) References Cited

FOREIGN PATENT DOCUMENTS

| | | |
|---|---|---|
| JP | 2010-140896 A | 6/2010 |
| JP | 2012-038677 A | 2/2012 |
| JP | 2013-175433 A | 9/2013 |
| JP | 2019-133816 A | 8/2019 |
| KR | 10-2018-0026267 A | 3/2018 |

\* cited by examiner

DISPLAY DEVICE AND ELECTRONIC DEVICE

CROSS REFERENCE TO RELATED APPLICATIONS

This application is a U.S. National Phase of International Patent Application No. PCT/JP2021/033015 filed on Sep. 8, 2021, which claims priority benefit of Japanese Patent Application No. JP 2020-152318 filed in the Japan Patent Office on Sep. 10, 2020. Each of the above-referenced applications is hereby incorporated herein by reference in its entirety.

TECHNICAL FIELD

The present disclosure relates to a display device and an electronic device. The present disclosure, in particular, relates to a display device including a light-emitting element, which has an organic layer, and an electronic device including the display device.

BACKGROUND ART

In a display device including a light-emitting element, which has an organic layer, and a color filter, it is important to suppress mixing of light and mixing of colors. The mixing occurs when light generated from a light-emitting element corresponding to a predetermined pixel enters a color filter corresponding to a pixel adjacent to the predetermined pixel.

For example, PTL 1 discloses a technique of aligning the sides of adjacent color filters. In PTL 2, a black matrix is disposed between adjacent color filters.

CITATION LIST

Patent Literature

[PTL 1]
  JP 2012-38677A
[PTL 2]
  JP 2006-73219A

SUMMARY

Technical Problem

Light generated from a light-emitting element corresponding to a predetermined pixel partly travels toward a color filter corresponding to an adjacent pixel. In the technique of PTL 1, the light is absorbed by an interface between the adjacent color filters, whereas in the technique of PTL 2, the light is absorbed by the black matrix. Thus, the techniques of PTL 1 and PTL 2 are susceptible to improvement in the extraction of light with higher efficiency.

The present disclosure has been devised in view of the foregoing point. An object of the present disclosure is to provide a display device and an electronic device that can suppress mixing of light and mixing of colors with efficient light extraction.

Solution to Problem

The present disclosure is, for example, (1) a display device including: a plurality of light-emitting elements having an organic layer;
a plurality of color filters disposed at positions corresponding to the respective light-emitting elements; and
a protective layer covering the side portions of the plurality of color filters,
wherein at a position between the adjacent color filters, a cavity portion is formed in the protective layer.

The present disclosure may be, for example, an electronic device including the display device according to (1).

DESCRIPTION OF EMBODIMENTS

Figure 1:
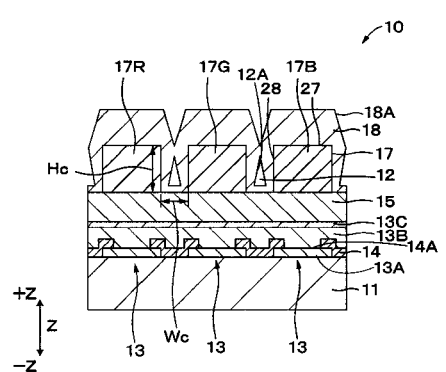
FIG. 1 is a cross-sectional view for explaining a display device according to a first embodiment.

An example according to the present disclosure will be described below with reference to the drawings. The description will be made in the order below. In the present specification and the drawings, configurations having substantially the same functional configuration are denoted by the same reference numerals, and repeated descriptions thereof are omitted.

The description will be made in the following order.
1. First Embodiment
2. Second Embodiment
3. Third Embodiment
4. Simulation example
5. Application examples The following description is a proper specific example of the present disclosure. The contents of the present disclosure are not limited to these embodiments and the like. For convenience of explanation, longitudinal, horizontal, and vertical directions are indicated in the following description but the contents of the present disclosure are not limited to these directions. In the examples of FIGS. 1, 8A, 8B, and 8C, the z-axis direction is the vertical direction (the +z direction extends upward, and the −z direction extends downward), the x-axis direction is the longitudinal direction (the +x direction extends to the front, and the −x direction extend to the rear), and the y-axis direction is the horizontal direction (the +y direction extends to the right, and the −y direction extends to the left). The description is based on these directions. The same applies to FIGS. 2A, 2B, 3A, 3B, 3C, 4A, 4B, 4C, 5A, 5B, 5C, 6A, 6B, 7A, 7B, 9A, 9B, 9C, 10, 11A, 11B, 11C, 12, 13, and 14. The relative proportions of the sizes and thicknesses of layers illustrated in the drawings including FIG. 1 are described for convenience. Actual proportions are not limited thereto. The same applies to FIGS. 2A, 2B, 3A, 3B, 3C, 4A, 4B, 4C, 5A, 5B, 5C, 6A, 6B, 7A, 7B, 8A, 8B, 8C, 9A, 9B, 9C, 10, 11A, 11B, 11C, 12, 13, and 14 regarding the definitions of these directions and the proportions.

1 First Embodiment

1-1 Configuration of Display Device

FIG. 1 is a cross-sectional view illustrating a configuration example of an organic EL (Electroluminescence) display device 10 (hereinafter simply referred to as "display device 10") according to an embodiment of the present disclosure. The display device 10 includes a substrate 11, a plurality of light-emitting elements 13, an insulating layer 14, an element protective layer 15, a plurality of color filters 17, and a filter protective layer 18.

The display device 10 is a top-emission display device. The substrate 11 is disposed on the back side of the display device 10, and the direction extending from the substrate 11 to the filter protective layer 18 (+z direction) is the front-side direction of the display device 10. The filter protective layer 18 is disposed on the top side, and the substrate 11 is disposed on the bottom side. In the following description, each layer constituting the display device 10 has a first surface (top surface) near the display surface of the display device 10 (+z direction) and a second surface (undersurface) near the back side of the display device 10 (−z direction).

The display device 10 may be a micro display. The display device 10 may be used for various electronic devices. An electronic device including the display device 10 is, for example, a display device for VR (Virtual Reality), MR (Mixed Reality), or AR (Augmented Reality), an electronic view finder (EVF), or a small projector.

(Substrate 11)

The substrate 11 has various circuits for driving the light-emitting elements 13. Specifically, on the first surface of the substrate 11, a drive circuit and a power supply circuit are provided (the circuits are not illustrated), the drive circuit including sampling transistors and driving transistors that control the driving of the light-emitting elements 13, the power supply circuit supplying power to the light-emitting elements 13.

The substrate 11 may be made of, for example, glass or resin having low moisture and oxygen permeability, or may be made of a semiconductor that facilitates the formation of transistors and the like. Specifically, the substrate 11 may be a glass substrate, a semiconductor substrate, a resin substrate, or the like. A glass substrate contains, for example, high strain-point glass, soda glass, borosilicate glass, forsterite, lead glass, or quartz glass. A semiconductor substrate contains, for example, amorphous silicon, polycrystalline silicon, monocrystalline silicon, or the like. A resin substrate contains, for example, at least one selected from the group consisting of polymethyl methacrylate, polyvinyl alcohol, polyvinyl phenol, polyethersulfone, polyimide, polycarbonate, polyethylene terephthalate, and polyethylene naphthalate.

On the first surface of the substrate 11, an insulating film, which is not illustrated, is typically formed over the drive circuit and the power supply circuit or the like. The insulating film has a plurality of contact plugs, which are not illustrated, to connect first electrodes 13A and the drive circuit, the first electrode 13A constituting the light-emitting element 13.

(Light-Emitting Element 13)

The light-emitting elements 13 are provided on the first surface of the substrate 11. The light-emitting elements 13 are disposed in, for example, a two-dimensional array (in the direction of the XY-plane) in a predetermined layout pattern, e.g., a matrix. The light-emitting element 13 is configured to emit white light. The light-emitting element 13 is, for example, a white OLED or a white Micro-OLED (MOLED). In the present embodiment, a method for colorization in the display device 10 is a method using the light-emitting elements 13 and the color filters 17. However, the colorization method is not limited thereto. An RGB coloring method or the like may be used instead. The color filters 17 may be replaced with monochromatic filters.

The light-emitting element 13 includes the first electrode 13A, an organic layer 13B, and a second electrode 13C. The first electrode 13A, the organic layer 13B, and the second electrode 13C are stacked in this order in the direction extending from the substrate 11 to the color filters 17 (+z direction).

(First Electrode 13A)

The first electrode 13A is provided on the insulating layer on the first surface of the substrate 11. The first electrode 13A is electrically isolated for each sub pixel by the insulating layer 14, which will be described later. The first electrode 13A is an anode. The first electrode 13A also acts as a reflective layer and is preferably made of a material having the maximum reflectivity and the largest work function in order to improve the luminous efficiency. A sub pixel indicates a minimum display section unit that has one color and is determined by further dividing a pixel serving as a section unit constituting a screen. For example, one pixel is configured with a combination of a red sub pixel, a green sub pixel, and a blue sub pixel that are adjacent to one another.

The first electrode 13A includes at least one of a metal layer and a metal oxide layer. More specifically, the second electrode 13C includes a single layer film of a metal layer or a metal oxide layer or a laminated film of a metal layer and a metal oxide layer. If the first electrode 13A includes a laminated film, a metal oxide layer may be provided near the organic layer 13B or a metal layer may be provided near the organic layer 13B. In view of the provision of a layer having a high work function next to the organic layer 13B, a metal oxide layer is preferably provided near the organic layer 13B.

The metal layer contains, for example, at least one metallic element selected from the group consisting of chromium (Cr), gold (Au), platinum (Pt), nickel (Ni), copper (Cu), molybdenum (Mo), titanium (Ti), tantalum (Ta), aluminum (Al), magnesium (Mg), iron (Fe), tungsten (W), and silver (Ag). The metal layer may contain the at least one metallic element as a constituent element of an alloy. Specific examples of alloys include aluminum alloys and silver alloys. Specific examples of aluminum alloys include AlNd and AlCu.

The metal oxide layer contains, for example, at least one of a mixture of indium oxide and tin oxide (ITO), a mixture of indium oxide and zinc oxide (IZO), and titanium oxide (TiO).

(Second Electrode 13C)

The second electrode 13C is opposed to the first electrode 13A. The second electrode 13C is provided as a common electrode for all sub pixels. The second electrode 13C is a cathode. The second electrode 13C is a transparent electrode that is transparent to light generated in the organic layer 13B. It is assumed that the transparent electrode includes a semi-transmissive reflective layer. The second electrode 13C is preferably made of a material having the maximum transmittance and the minimum work function in order to improve the luminous efficiency.

The second electrode 13C includes at least one of a metal layer and a metal oxide layer. More specifically, the second electrode 13C includes a single layer film of a metal layer or a metal oxide layer or a laminated film of a metal layer and a metal oxide layer. If the second electrode 13C includes a laminated film, a metal layer may be provided near the organic layer 13B or a metal oxide layer may be provided near the organic layer 13B. In view of the provision of a layer having a low work function next to the organic layer 13B, a metal layer is preferably provided near the organic layer 13B.

The metal layer contains, for example, at least one metallic element selected from the group consisting of magnesium (Mg), aluminum (Al), silver (Ag), calcium (Ca), and sodium (Na). The metal layer may contain the at least one metallic element as a constituent element of an alloy. Specific examples of alloys include MgAg alloys, MgAl alloys, and AlLi alloys. Metal oxides include, for example, at least one of a mixture of indium oxide and tin oxide (ITO), a mixture of indium oxide and zinc oxide (IZO), and zinc oxide (ZnO).

(Organic Layer 13B)

The organic layer 13B is provided between the first electrode 13A and the second electrode 13C. The organic layer 13B is provided as an organic layer shared by all sub pixels. The organic layer 13B is configured to emit white light. This does not prohibit luminescent colors other than white from the organic layer 13B. Colors such as red, blue, and green may be used. In other words, the luminescent color of the organic layer 13B may be, for example, any one of white, red, blue, and green.

The organic layer 13B has a configuration in which a hole injection layer, a hole transport layer, a light-emitting layer, and an electron transport layer are stacked in this order from the first electrode 13A to the second electrode 13C. Note that the configuration of the organic layer 13B is not limited thereto, and layers other than the light-emitting layer are optionally provided.

The hole injection layer is a buffer layer for increasing the efficiency of hole injection into the light-emitting layer and suppressing leakage. The hole transport layer is provided for increasing the efficiency of transporting holes to the light-emitting layer. In the light-emitting layer, the application of an electric field causes recombination of electrons and holes, thereby generating light. The light-emitting layer is an organic light-emitting layer containing an organic light-emitting material. The electron transport layer is provided for increasing the efficiency of transporting electrons to the light-emitting layer. An electron injection layer may be provided between the electron transport layer and the second electrode 13C. This electron injection layer is provided for increasing the efficiency of electron injection.

(Insulating Layer 14)

The insulating layer 14 is provided on an insulating film formed on the first surface of the substrate 11. The insulating layer 14 electrically isolates the first electrodes 13A for the respective light-emitting elements 13 (that is, for the respective sub pixels). The insulating layer 14 has a plurality of openings 14A, and the first surfaces of the isolated first electrodes 13A (the surfaces opposed to the second electrode 13C) are exposed from the openings 14A. The isolated first electrode 13A may be covered with the insulating layer 14 from the peripheral portion of the first surface to the side (end face) of the first electrode 13A. In the present specification, the peripheral portion of the first surface refers to a region having a predetermined width in an inward direction from the edge of the first surface.

The insulating layer 14 is made of, for example, an organic material or an inorganic material. The organic material contains, for example, at least one of polyimide and acrylic resin. The inorganic material contains, for example, at least one of silicon oxide, silicon nitride, silicon oxynitride, and aluminum oxide. If the light-emitting elements 13 are isolated by the processing of the first electrode 13A, the organic layer 13B, and the second electrode 13C, the insulating layer 14 may be omitted.

(Element Protective Layer)

The element protective layer 15 is provided on the first surface of the second electrode 13C and covers the light-emitting elements 13. The element protective layer 15 blocks outside air from reaching the light-emitting elements 13 and suppresses the entry of moisture and oxygen into the light-emitting elements 13 from an external environment. If the second electrode 13C is configured with a metal layer, the element protective layer 15 may have the function of suppressing oxidation of the metal layer.

The element protective layer 15 is made of, for example, an inorganic material. The inorganic material constituting the element protective layer 15 is preferably less hygroscopic. Specifically, the inorganic material constituting the protective layer 15 preferably contains at least one selected from the group consisting of silicon oxide (SiO), silicon nitride (SiN), silicon oxynitride (SiNO), titanium oxide (TiO) and aluminum oxide ($Al_2O_3$). The element protective layer 15 may have a single-layer structure but may have a multilayer structure when the thickness is increased. The structure is provided to reduce an internal stress in the element protective layer 15.

(Color Filter)

The color filters 17 are formed on the element protective layer 15. The color filters 17 are, for example, on-chip color filters (OCCFs). As illustrated in the example of FIG. 1, the color filters 17 can be, for example, a red filter 17R, a green filter 17G, and a blue filter 17B. The red filter 17R, the green filter 17G, and the blue filter 17B are opposed to the light-emitting element 13 for the red sub pixel, the light-emitting element 13 for the green sub pixel, and the light-emitting element 13 for the blue sub pixel, respectively. Thus, white light emitted from the light-emitting elements 13 in the red sub pixel, the green sub pixel, and the blue sub pixel passes through the red filter 17R, the green filter 17G, and the blue filter 17B, respectively, so that red light, green light, and blue light are emitted from the display surface. The example of FIG. 1 is merely exemplary and does not limit the type of the color filter to a combination of three colors: red, green, and blue. For example, the type of the color filter may be a combination of four colors: red, green, blue, and white.

The color filters 17 (the red filter 17R, the green filter 17G, and blue filter 17B in the example of FIG. 1) are separated from one another.

The ratio (Hc/Wc) of the height of the color filter 17 (denoted by reference character He in FIG. 1) to an interval between the adjacent color filters 17 (denoted by reference character We in FIG. 1) is preferably equal to or larger than 1 (the ratio (Hc/Wc) is referred to as an aspect ratio in the present specification). Since the aspect ratio is 1 or larger, a cavity portion 12 is easily formed in the filter protective layer 18 between the adjacent color filters 17.

(Color Filter Layout)

In the layout of the color filters 17 in the example of FIG. 1, the red filter 17R, the green filter 17G, and the blue filter 17B are repeatedly placed in this order. Moreover, in this example, the color filters 17 (the red filter 17R, the green filter 17G, and the blue filter 17B) are formed into stripes on the XY plane as illustrated in FIG. 8C. FIG. 8C is an explanatory drawing illustrating an example of the layout of the color filters. The XY plane is a plane on which the Z-axis direction in FIG. 1 and other drawings serves as a normal. This applies to FIGS. 8A, 8B, 9A, 9B, and 9C.

(Filter Protective Layer)

The filter protective layer 18 is disposed over side portions 28 of the color filters 17. The filter protective layer 18 has the function of regulating deterioration of the exposed side portions 28 of the color filters 17 (the red filter 17R, the green filter 17G, and the blue filter 17B). The filter protective layer 18 is preferably made of the same material as the element protective layer 15. Specifically, the filter protective layer 18 is made of, for example, an inorganic material like the element protective layer 15. The inorganic material may be, for example, silicon oxide (SiO), silicon nitride (SiN), or aluminum oxide ($Al_2O_3$). Silicon oxide (SiO) and silicon nitride (SiN) are preferably formed by plasma vapor deposition (P—SiO, P—SiN).

As illustrated in FIG. 1, the filter protective layer 18 preferably covers a portion (top surface portion 27) constituting the first surface of the color filter 17. In the example of the display device 10 in FIG. 1, the filter protective layer 18 covers both of the top surface portion 27 and the side portions 28 of the color filter 17. The filter protective layer 18 has a portion covering the top surface portion 27 of the color filter 17 and portions covering the side portions 28 of the color filter 17 such that the portions are integrally formed using the same material. However, this does not prohibit the use of different materials for the filter protective layer 18 covering the top surface portion 27 of the color filter 17 and the filter protective layer 18 covering the side portions 28 of the color filter 17.

In the example of the display device 10 of FIG. 1, convex and concave portions are formed on the first surface of the filter protective layer 18, convex portions 18A trapezoidal in cross section are consecutively formed, and the concave portions connect the adjacent convex portions. The convex portions 18A are formed above the top surface portions 27 of the color filters 17 and are shaped and sized according to the layout of the sub pixels. When the convex portions 18A are formed above the top surface portions 27 of the color filters 17, an adjustment to the shapes of the convex portions 18A can provide a lens function for the filter protective layer 18. This does not prohibit flattening of the first surface (front side) of the filter protective layer 18. The first surface of the filter protective layer 18 may be a flat surface. For example, if a lens 20 is additionally provided as described in the example (FIG. 12) of a third embodiment, which will be described later, a flattening layer 19 may be omitted because the filter protective layer 18 has a flat surface.

The refractive index of the filter protective layer 18 is preferably equal to or lower than that of the color filter 17. Because of the relationship between the refractive indexes of the filter protective layer 18 and the color filter 17, when light reflected on the contact interface between the filter protective layer 18 and the cavity portion 12 travels toward the color filter 17 and reaches the interface between the filter protective layer 18 and the color filter 17, the light is hardly reflected on the interface between the filter protective layer 18 and the color filter 17. Thus, the reflection of light is hardly repeated in the filter protective layer 18, thereby suppressing an excessive increase in luminance around the color filters 17.

The refractive index of the filter protective layer 18 is preferably equal to or lower than that of the element protective layer 15. Because of the relationship between the refractive indexes of the filter protective layer 18 and the element protective layer 15, light generated in the light-emitting element 13 is hardly reflected on the interface between the filter protective layer 18 and the element protective layer 15 when reaching the interface. As will be described in, in particular, modification 5, if the element protective layer 15 has a step portion 21 and a contact interface is formed between the step surface (side portion 21B) of the step portion 21 and the filter protective layer 18, the contact interface between the filter protective layer 18 and the element protective layer 15 may be formed below the color filter 17. In this case, since the refractive index of the filter protective layer 18 is equal to or lower than that of the element protective layer 15, the reflection of light on the contact interface between the filter protective layer 18 and the element protective layer 15 is suppressed so as to encourage light to travel to the color filter 17 disposed above the contact interface.

The material of the filter protective layer 18 preferably has a lower step coverage value than the material of the element protective layer 15 or the like. The formation of the filter protective layer 18 made of such a material can form the cavity portion 12 with higher efficiency.

(Cavity Portion)

In the display device 10 of FIG. 1, the cavity portion 12 is formed in the filter protective layer 18 between the adjacent color filters 17.

In the example of FIG. 1, the cavity portion 12 is formed in a forward-tapered shape in cross section. The forward-tapered shape means that a cone angle (a cone angle ß in FIG. 14) formed by the interface (a side wall surface 12A of the cavity portion 12 in FIG. 14) between the cavity portion 12 and the filter protective layer 18 and a horizontal plane (a horizontal plane E in FIG. 14) is smaller than 90°. In view of the encouragement of total reflection of light to suppress leakage of light to an adjacent sub pixel with light extraction of higher efficiency, the cavity portion 12 is more preferably formed in a forward-tapered shape at a cone angle ß of 70° or less.

In the example of FIG. 1, the cavity portion 12 has the lower end disposed higher than the lower end of the color filter 17 and the upper end disposed lower than the top surface portion of the color filter 17 in the vertical direction. The cavity portion 12 is preferable if at least a part of the cavity portion 12 is formed between the adjacent color filters. The lower end of the cavity portion 12 (one end in the −z direction) is preferably disposed at a lowest position. Since the cavity portion 12 is formed with the lower end at the lowest position, the leakage of light to the color filter 17 near the adjacent sub pixel is suppressed even if the sub pixels are disposed in a finer pattern. The upper end of the cavity portion 12 is not particularly limited and may be disposed higher than the top surface portion 27 of the color filter 17 (+z direction).

1-2 Method for Manufacturing Display Device According to First Embodiment

An example of a method for manufacturing the display device 10 according to an embodiment of the present disclosure will be described below.

First, a drive circuit and a power supply circuit or the like are formed on the first surface of the substrate 11 by, for example, thin film formation, photolithography, and etching. Subsequently, an insulating film is formed on the first surface of the substrate 11 so as to cover the drive circuit and the power supply circuit according to, for example, CVD, and then a plurality of contact plugs are formed on the insulating film.

Thereafter, a laminated film of a metal layer and a metal oxide layer is formed on the first surface of the substrate 11 by, for example, sputtering, and then the laminated film is patterned by, for example, photolithography and etching. Thus, the first electrodes 13A separated for the respective light-emitting element 13 (that is, for the respective sub pixels) are formed.

The insulating layer 14 is then formed on the insulating-film forming surface (first surface) of the substrate 11 by, for example, CVD so as to cover the first electrodes 13A, and then the insulating layer 14 is patterned by photolithography and etching. Thus, the openings 14A are formed on the insulating layer 14.

The organic layer 13B is then formed by stacking the hole injection layer, the hole transport layer, the light-emitting layer, and the electron transport layer in this order on the first surface of the first electrode 13A by, for example, vapor deposition. Subsequently, the second electrode 13C is formed on the first surface of the organic layer 13B by, for example, vapor deposition or sputtering. Thus, the light-emitting elements 13 are formed on the first surface of the substrate 11.

Figure 2A:
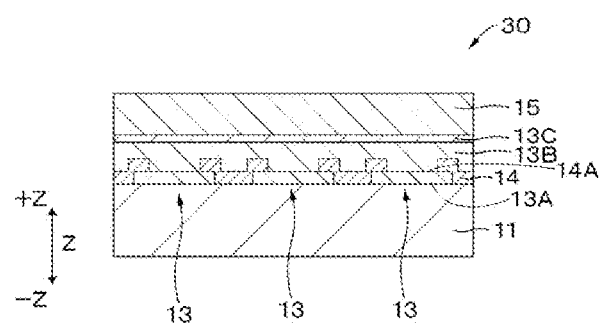
FIGS. 2A and 2B are cross-sectional views for explaining a method for manufacturing the display device according to the first embodiment.

The element protective layer 15 is then formed on the first surface of the second electrode 13C by, for example, CVD or vapor deposition. This obtains an element laminate 30 in which the light-emitting elements 13 and the element protective layer 15 are formed on the first surface of the substrate 11 (FIG. 2A).

Figure 2B:
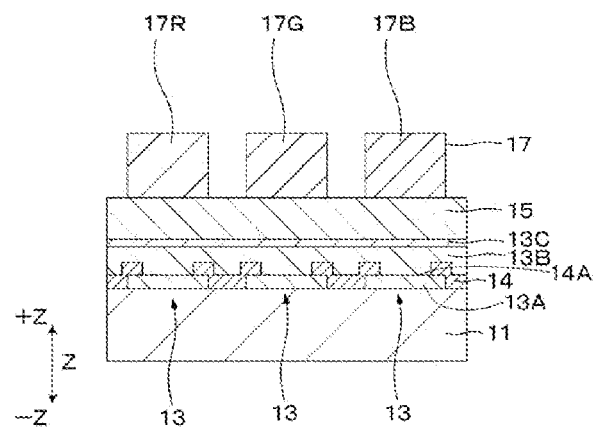

For the element laminate 30, the color filters 17 are formed on the first surface of the element protective layer 15. The color filters 17 are spaced and are formed in shapes determined according to the layout of the sub pixels and the pixels (FIG. 2B). The color filters 17 can be formed by applying, for example, photolithography. In the example of FIG. 2B, the red filter 17R, the green filter 17G, and the blue filter 17B are spaced and are formed into stripes.

The filter protective layer 18 is then formed on the first surfaces of the color filters 17. Like the element protective layer 15, the filter protective layer 18 can be formed by, for example, CVD or vapor deposition. At this point, various conditions for forming the protective layers are determined. The conditions include the ratio of a distance between the adjacent color filters 17 to the height of the color filter 17 (aspect ratio), the thickness of the filter protective layer 18, and the step coverage of the material of the filter protective layer 18. Thus, the cavity portion 12 is formed in the filter protective layer 18 between the adjacent color filters 17 according to the conditions for forming the protective layers. The cone angle ß and the lower end position or the like of the cavity portion 12 are also controlled under the conditions for forming the protective layers.

The filter protective layer 18 is preferably formed in a cold condition in view of the suppression of deterioration of the color filters 17 and the light-emitting elements 13. Specifically, the filter protective layer 18 is preferably formed in a temperature condition of, for example, 100° C. or lower in view of the formation of the cavity portion 12 while keeping the performance of the color filters 17 and the light-emitting elements 13.

Thus, the display device 10 in FIG. 1 is obtained.

1-3 Operation and Effect

In the display device 10, the cavity portion 12 is formed in the filter protective layer 18 between the adjacent color filters 17. Thus, light diagonally passing through the color filter 17 hardly leaks into the adjacent sub pixel, thereby suppressing mixing of light and mixing of colors. Furthermore, light traveling toward the adjacent sub pixel is reflected on the contact interface between the filter protective layer 18 and the cavity portion 12 and can be extracted from the first surface to the outside, thereby extracting light with higher efficiency.

As illustrated in the display device 10 in FIG. 1, the top surface portion 27 and the side portions 28 of the color filter 17 are covered with the filter protective layer 18, thereby improving the suppression of swelling and degassing of the color filters 17. Moreover, the filter protective layer 18 is formed over the color filters 17 and is in contact with the element protective layer 15 between the adjacent color filters 17. This can suppress exfoliation between the color filters 17 and the element protective layer 15 and improve adhesion between the color filters 17 and the element protective layer 15.

Furthermore, as illustrated in the display device 10 of FIG. 1, if the shape of the first surface of the filter protective layer 18 is adjusted into convex and concave surfaces to provide the function of a lens for the filter protective layer 18, the step of additionally providing lenses on the filter protective layer 18 during the manufacturing of the display device can be omitted, thereby reducing the number of steps of manufacturing the display device.

1-4 Modifications (Modification 1)

Figure 3A:
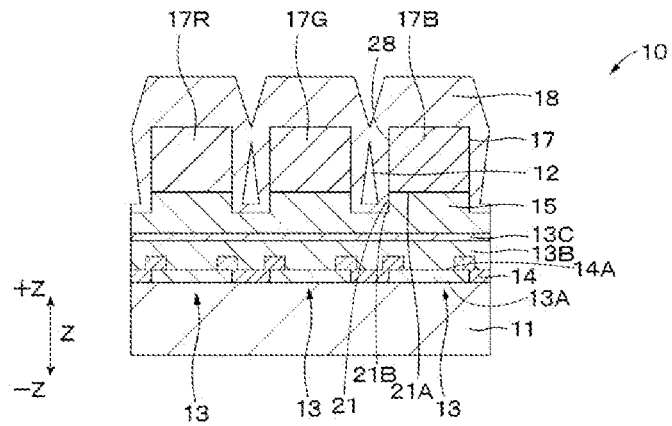
FIGS. 3A, 3B, and 3C are cross-sectional views for explaining the display device according to modifications of the first embodiment.

In the example of the display device 10 in FIG. 1, the top surface (first surface) of the element protective layer 15 is a flat surface but is not limited thereto. As illustrated in FIG. 3A, step portions 21 may be formed on the first surface of the element protective layer 15. If the step portions 21 are formed on the element protective layer 15, the color filter 17 is disposed on an upper surface 21A of the step portion 21, so that the lower end of the filter protective layer 18 can be disposed at a lower position (a position in the −z direction) than the color filters 17. Thus, the lower end of the cavity portion 12 that is formed in the filter protective layer 18 can be also disposed lower than the color filters 17. If the color filter 17 is disposed on the upper surface 21A of the step portion 21, as illustrated in FIG. 3A, the color filter 17 may be disposed such that the side portion 21B of the step portion 21 and the side portion 28 of the color filter 17 are flush with each other. Alternatively, the color filter 17 may be disposed such that the side portion 21B of the step portion 21 and the side portion 28 of the color filter 17 are displaced from each other as will be described later.

In the example of the display device 10 in FIG. 3A, when a direction (−z direction) from the color filter 17 to the light-emitting element along the thickness direction (z-axis direction) of the color filter 17 is denoted as a downward direction, the lower end of the cavity portion 12 is disposed lower than the color filters 17 and higher than the light-emitting elements 13. In the display device 10 of modification 1, the lower end of the cavity portion 12 is disposed at a lower position (a height h of the cavity portion 12 in FIG. 13 decreases), thereby extracting light with higher efficiency as will be described in a simulation example.

(Method for Manufacturing Display Device According to Modification 1)

Figure 4A:
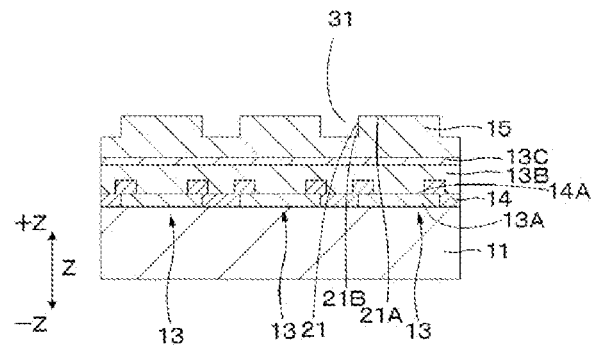
FIGS. 4A, 4B, and 4C are cross-sectional views for explaining the method for manufacturing the display device according to modifications of the first embodiment.
Figure 4B:
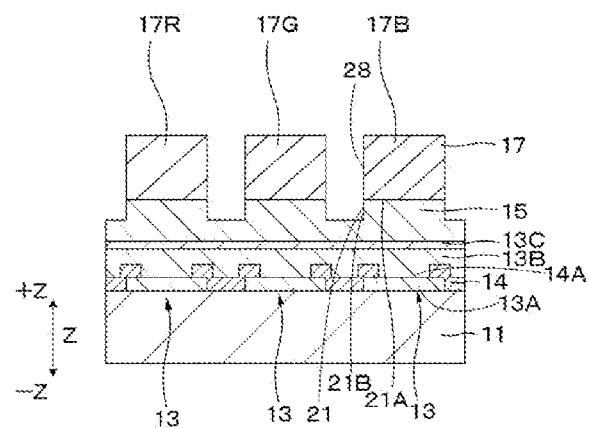

For example, the display device 10 configured thus can be manufactured as illustrated in FIGS. 4A and 4B. FIGS. 4A and 4B are cross-sectional views for explaining the steps of manufacturing the display device 10 according to modification 1. The same steps as in the method for manufacturing the display device 10 according to the first embodiment are performed to form the element laminate 30 illustrated in FIG. 2A. On the element laminate 30, groove portions 31 are formed at predetermined positions by, for example, photolithography and etching, so that the step portions 21 are formed (FIG. 4A).

As illustrated in FIG. 4B, the color filters 17 are formed on the upper surfaces 21A of the step portions 21 of the element protective layer 15. The color filters 17 are spaced and are formed in shapes determined according to the layout of the sub pixels and the pixels. The color filters 17 can be formed by applying, for example, photolithography. In the example of FIG. 4B, the red filter 17R, the green filter 17G, and the blue filter 17B are spaced and are formed into stripes.

The filter protective layer 18 is then integrally formed on the first surfaces of the color filters 17, between the adjacent color filters, and between the adjacent step portions 21. The filter protective layer 18 can be formed as in the method for manufacturing the display device 10 according to the first embodiment. At this point, the cavity portion 12 is formed in the filter protective layer 18 between the adjacent color filters 17 and in the filter protective layer 18 between the adjacent step portions 21. In other word, the cavity portion 12 is formed in a lower portion between the adjacent color filters 17 such that the lower end of the cavity portion 12 is disposed between the adjacent step portions 21. Hence, the display device 10 illustrated in FIG. 3A can be formed.

(Modification 2)

Figure 3B:
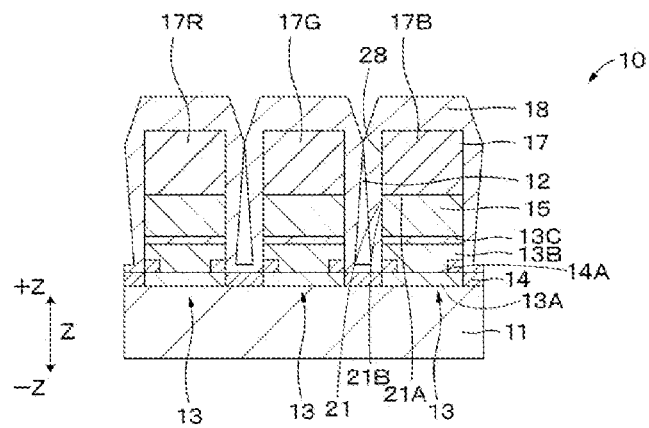

In the display device 10 according to modification 1 in FIG. 3A, the lower end of the cavity portion 12 is disposed higher than the light-emitting elements 13 but the lower end of the cavity portion 12 is not limited to the position. As illustrated in FIG. 3B, when a direction from the color filter 17 to the light-emitting element 13 along the thickness direction of the color filter 17 is denoted as a downward direction, the lower end of the cavity portion 12 may be disposed between the adjacent light-emitting elements 13 (modification 2). At this point, regarding a position in the vertical direction (a position in the z-axis direction), the lower end of the cavity portion 12 may be disposed at the position of the second electrode 13C or the organic layer 13B or may be disposed at the position of the first electrode 13A. In the display device 10 of modification 2, the lower end of the cavity portion 12 is disposed at a lower position, thereby extracting light with higher efficiency as will be described in the simulation example.

(Modification 3)

Figure 3C:
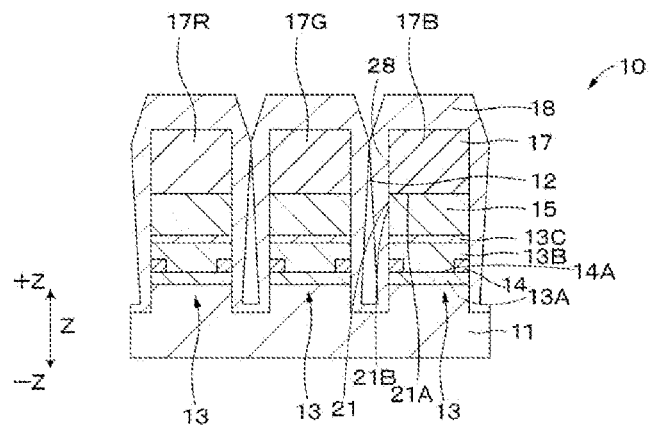

The lower end of the cavity portion 12 is not limited to modifications 1 and 2. As illustrated in FIG. 3C, when a direction from the color filter 17 to the light-emitting element 13 along the thickness direction of the color filter 17 is denoted as a downward direction, the lower end of the cavity portion 12 may be disposed lower than a portion between the adjacent light-emitting elements 13 (modification 3). In the display device 10 of modification 3, the lower end of the cavity portion 12 is disposed at a lower position, thereby extracting light with higher efficiency as in modification 2 as will be described in the simulation example. Moreover, in the display device 10 according to modification 3, the adjacent light-emitting elements 13 can be separated by the filter protective layer 18 and the cavity portion 12.

(Modification 4)

Figure 6A:
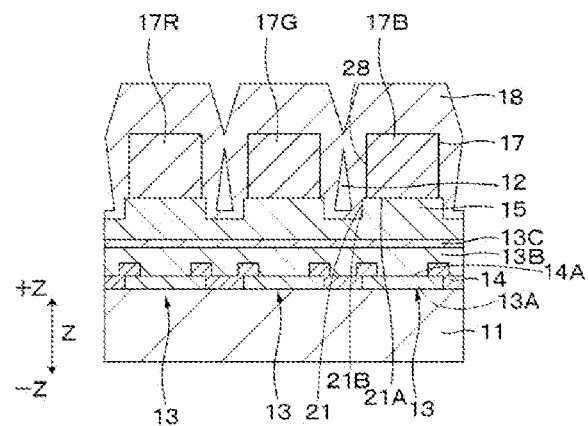
FIGS. 6A and 6B are cross-sectional views for explaining the display device according to modifications of the first embodiment.

In modifications 1 to 3, the color filter 17 is disposed such that the side portion 21B of the step portion 21 and the side portion 28 of the color filter 17 are flush with each other. In the display device 10, the color filter 17 may be disposed such that the side portion 21B of the step portion 21 and the side portion 28 of the color filter 17 are displaced from each other. For example, as illustrated in FIG. 6A, the color filter 17 may be disposed in the upper surface 21A of the step portion 21 in the display device 10 (modification 4).

(Method for Manufacturing Display Device According to Modification 4)

Figure 4C:
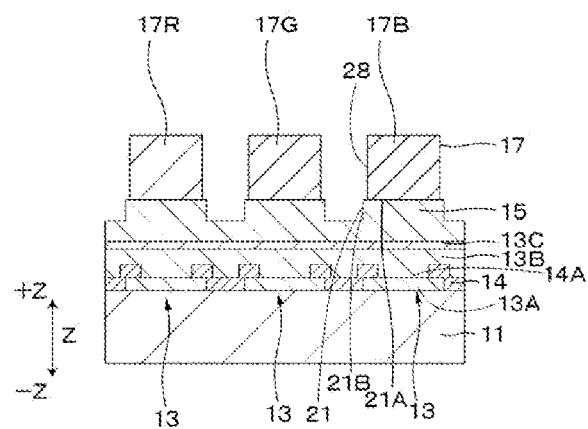

As illustrated in, for example, FIG. 4C, the display device 10 configured thus can be manufactured by performing the same steps as the display device according to modification 1 except for the color filter 17 disposed in the upper surface 21A of the step portion 21.

(Modification 5)

In modification 4, the color filter 17 is disposed in the upper surface 21A of the step portion 21, as the color filter 17 disposed such that the side portion 21B of the step portion 21 and the side portion 28 of the color filter 17 are displaced from each other. The placement of the color filter 17 is not limited thereto.

Figure 6B:
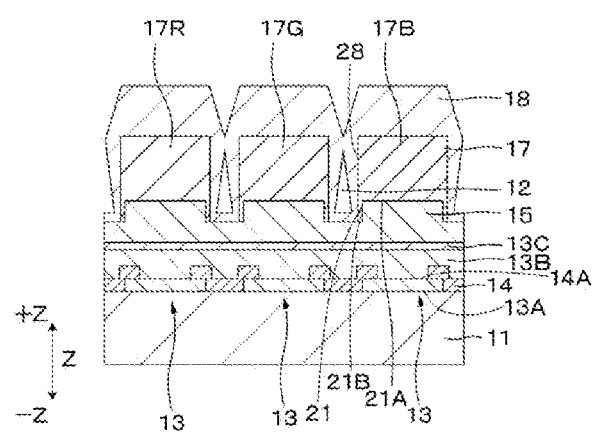

In the display device 10, as illustrated in FIG. 6B, the color filter 17 may be disposed to cover the upper surface 21A and the side portions 21B of the step portion 21 of the element protective layer 15 (modification 5). In this case, the color filter 17 is disposed such that the upper surface 21A and the side portions 21B of the step portion 21 are placed into the color filter 17, and the side portion 21B of the step portion 21 and the side portion 28 of the color filter 17 are displaced from each other.

In the display device 10 of modification 5, a contact area between the color filter 17 and the element protective layer 15 increases, thereby further improving adhesion between the color filter 17 and the element protective layer 15.

Moreover, in the display device 10 of modification 5, light can be extracted with higher efficiency as in the display device of modification 1.
(Method for Manufacturing Display Device According to Modification 5)

Figure 5A:
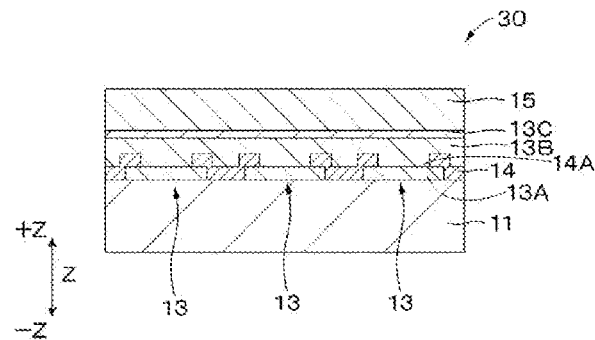
FIGS. 5A, 5B, and 5C are cross-sectional views for explaining the method for manufacturing the display device according to a modification of the first embodiment.
Figure 5B:
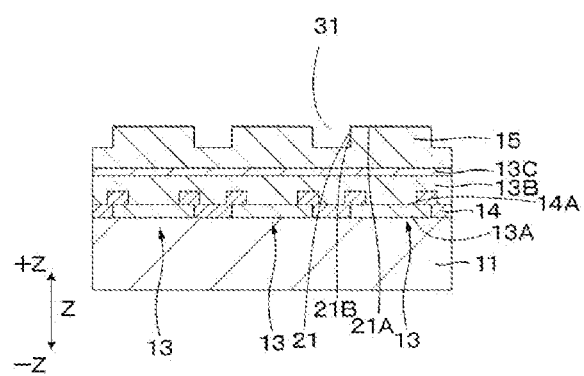
Figure 5C:
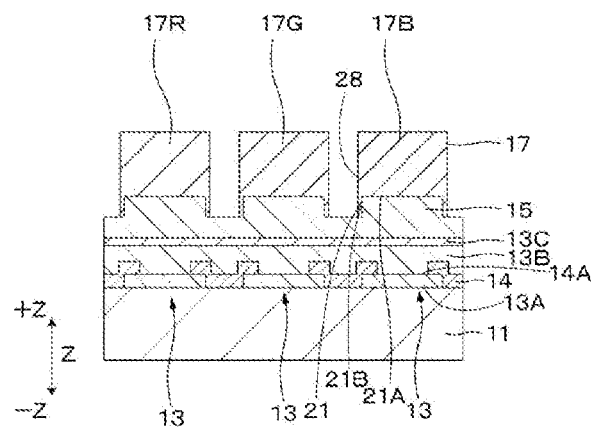

For example, the display device 10 according to modification 5 can be manufactured as illustrated in FIGS. 5A, 5B, and 5C. FIGS. 5A, 5B, and 5C are cross-sectional views for explaining the steps of manufacturing the display device 10 according to modification 5. The element laminate 30 is formed by the same steps as in the method for manufacturing the display device according to modification 1 (FIG. 5A). The step portions 21 are formed by the same steps as in the method for manufacturing the display device according to modification 1 (FIG. 5B). As illustrated in FIG. 5C, the color filters 17 are then formed such that the step portions 21 are covered with the color filters 17.

Subsequently, the filter protective layer 18 is integrally formed on the first surfaces of the color filters 17 and between the adjacent color filters 17. The filter protective layer 18 can be formed as in the method for manufacturing the display device 10 according to the first embodiment. At this point, the cavity portion 12 is formed in the filter protective layer 18 between the adjacent color filters 17. Hence, the display device 10 illustrated in FIG. 6B can be formed.
(Modification 6)

Figure 7A:
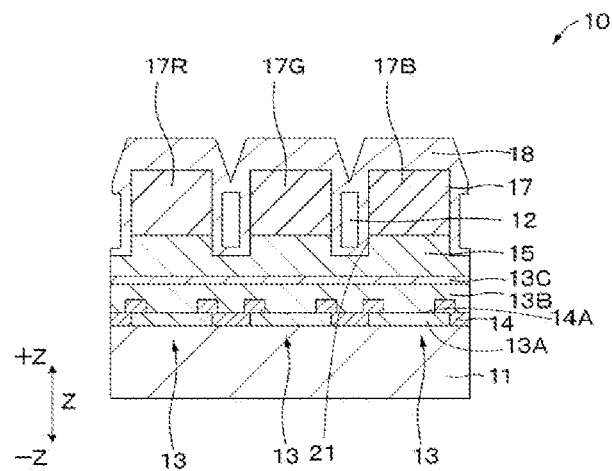
FIGS. 7A and 7B are cross-sectional views for explaining the display device according to a modification of the first embodiment.
Figure 7B:
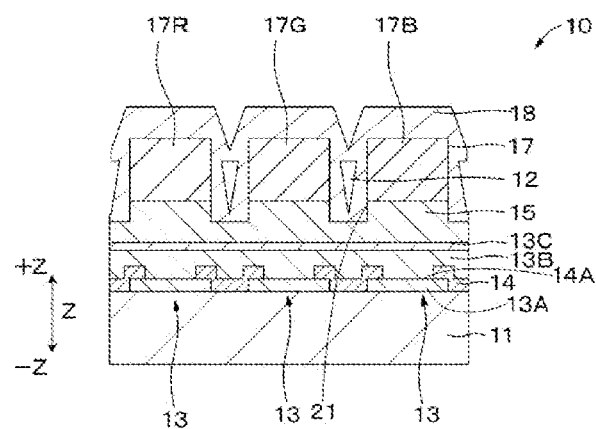

The shape of the cavity portion 12 in cross section is not limited to the tapered shape in the example of FIG. 1. The cavity portion 12 may be formed in a non-tapered shape in cross section as illustrated in FIG. 7A. The non-tapered shape may be, for example, a polygonal shape having four or more sides, e.g., a rectangle in FIG. 7A or a shape having a curved portion. Alternatively, the cavity portion 12 may have a reversely tapered shape in cross section as illustrated in FIG. 7B. Also in this case, light can be used with higher efficiency than a configuration not provided with the cavity portion 12. FIGS. 7A and 7B illustrate the cavity portion 12 in a non-tapered shape in cross section and the cavity portion 12 in a reversely tapered shape in cross section, respectively, according to modification 1.
(Modification 7)

The cavity portion 12 is typically filled with air. The cavity portion 12 may be filled with predetermined gas other than air. The gas may be, for example, nitrogen, carbon dioxide, or rare gas. If the cavity portion 12 is filled with air, the cavity portion 12 has a refractive index of about 1.
(Modification 8)

Figure 10:
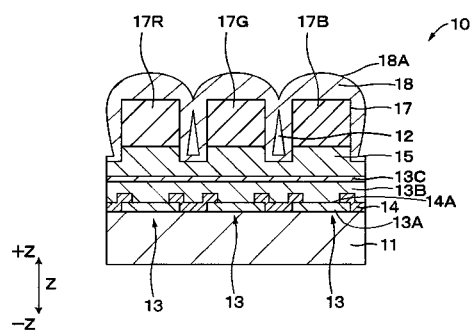
FIG. 10 is a cross-sectional view for explaining the display device according to a modification of the first embodiment.

If the first surface of the filter protective layer 18 is formed into convex and concave surfaces, the convex portions 18A of the filter protective layer 18 are not limited to trapezoidal shapes in cross section in, for example, FIG. 1. The convex portions 18A of the filter protective layer 18 may be dome-shaped as illustrated in FIG. 10. FIG. 10 illustrates the dome-shaped convex portions 18A on the first surface of the filter protective layer 18 according to modification 1. In the example of FIG. 10, the convex portions 18A are formed so as to be connected to one another. Portions connecting the adjacent convex portions 18A are concave portions. The convex portions 18A are formed on the respective color filters 17. The shapes and sizes of the convex portions 18A are determined according to the layout of the sub pixels. If the convex portions 18A are formed on the color filters 17, the convex portions 18A are adjusted to be dome-shaped, thereby proving the filter protective layer 18 with the function of a lens.

(Modification 9)

In the display device of FIG. 1, the color filters 17 are arranged in a stripe array as illustrated in FIG. 8C. The display device 10 of the present embodiment is not limited to this arrangement. The arrangement of the color filters 17 may be a square array illustrated in FIG. 8A or a delta array illustrated in FIG. 8B. In FIG. 8C, the color filters 17 are arranged in three kinds of stripes: the red filter 17R, the green filter 17G, and the blue filter 17B. As illustrated in FIG. 9C, the color filters 17 may be four kinds of color stripes. In FIG. 9C, a white filter 17W, the red filter 17R, the green filter 17G, and the blue filter 17B are combined into stripes. This also applies to a square array and a delta array as an array of the color filters 17 as illustrated in FIGS. 8A, 8B, 9A, and 9B.

Figure 8A:
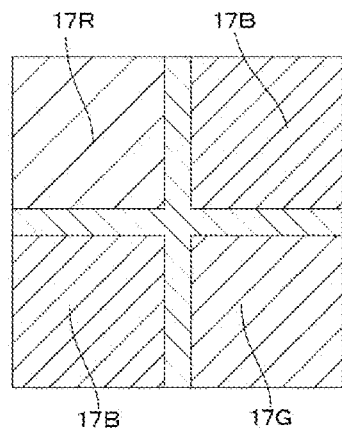
FIGS. 8A, 8B, and 8C illustrate examples of the layout of color filters.
Figure 8B:
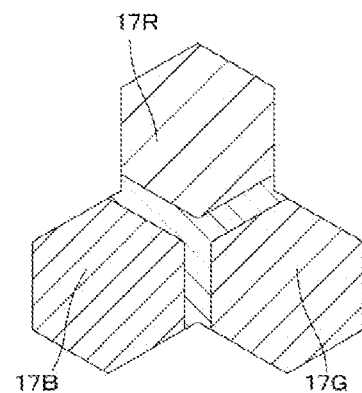
Figure 8C:
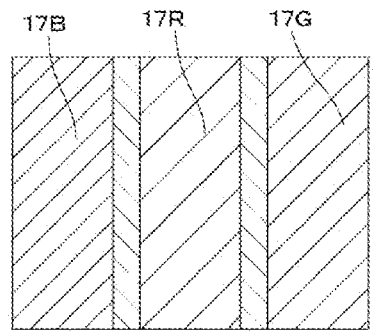
Figure 9A:
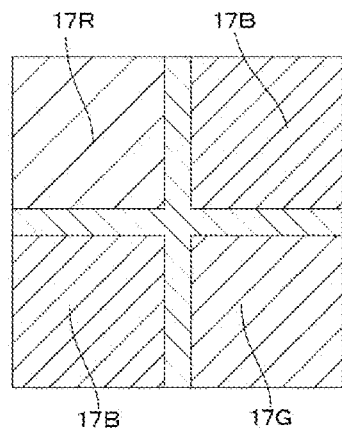
FIGS. 9A, 9B, and 9C illustrate examples of the layout of the color filters.
Figure 9B:
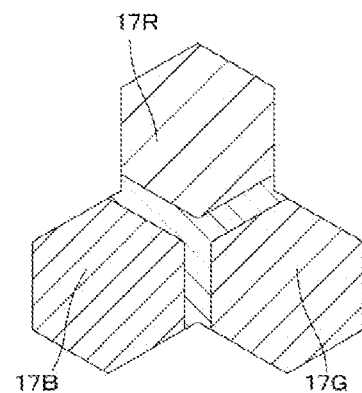
Figure 9C:
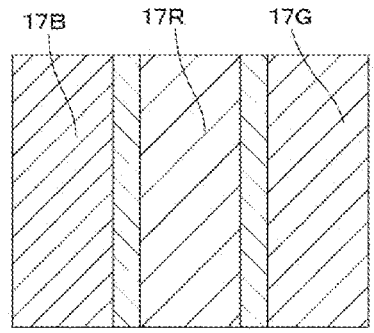

Specifically, in the example of FIG. 8A, one red filter 17R, two blue filters 17B, and one green filter are combined into a square array for one pixel. In the example of FIG. 9A, one white filter 17W, one red filter 17R, one green filter 17G, and one blue filter 17B are combined into a square array for one pixel. In the example of FIG. 8B, the red filter 17R, the green filter 17G, and the blue filter 17B are disposed in a delta array. In the example of FIG. 9B, the white filter 17W, the red filter 17R, the green filter 17G, and the blue filter 17B are disposed in a delta array.

2. Second Embodiment

Figure 11A:
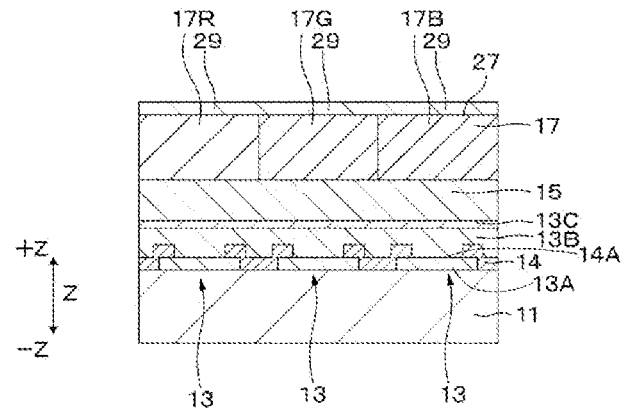
FIGS. 11A and 11B are cross-sectional views for explaining a method for manufacturing a display device according to a modification of a second embodiment.
Figure 11B:
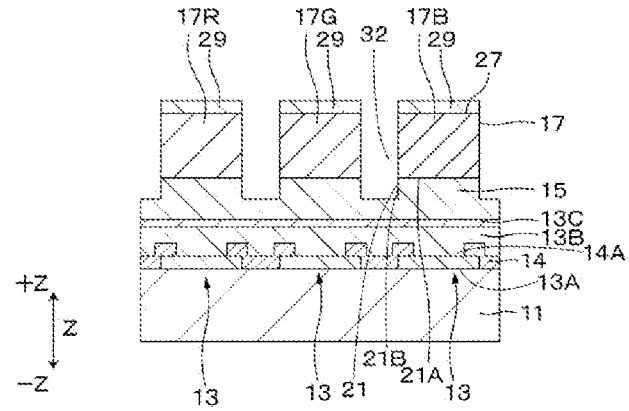
Figure 11C:
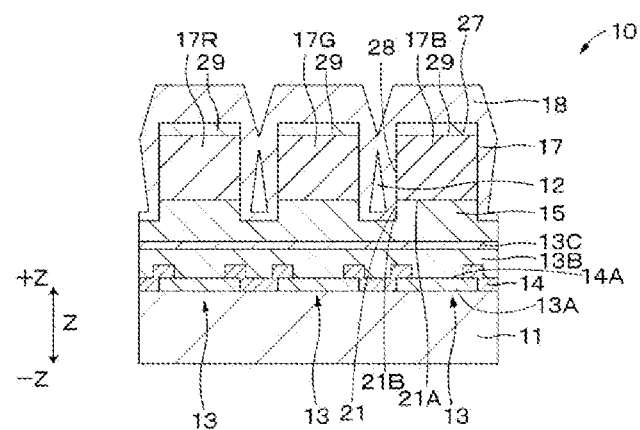
FIG. 11C is a cross-sectional view for explaining the display device according to the modification of the second embodiment.

In the display device 10 according to the first embodiment, as illustrated in FIG. 11C, a filter top-surface protective film 29 may be formed between the top surface portion 27 of the color filter 17 and the filter protective layer 18 (second embodiment). FIG. 11C illustrates the filter top-surface protective film 29 that is formed according to modification 1 of the first embodiment.
(Filter Top-Surface Protective Film)

The filter top-surface protective film 29 is a film for regulating the exposure of the top surface portion 27 of the color filter 17. The filter top-surface protective film 29 can more securely suppress surface deterioration of the color filter 17 when the filter protective layer 18 is formed. The material of the filter top-surface protective film 29 may be, for example, silicon oxide (SiO), silicon nitride (SiN), or aluminum oxide ($Al_2O_3$) like the element protective layer 15 and the filter protective layer 18.

A display device 10 according to a second embodiment can be manufactured as illustrated in, for example, FIGS. 11A and 11B. FIGS. 11A and 11B are explanatory drawings of the steps of manufacturing the display device according to the second embodiment. The same steps as the method for manufacturing the display device according to the first embodiment are performed before the step of forming an element laminate 30.

For the element laminate 30, the color filters 17 are formed on the first surface of the element protective layer 15. The red filter 17R, the green filter 17G, and the blue filter 17B are formed into stripes. At this point, the color filters 17 are not spaced. The filter top-surface protective film 29 is then formed on the first surfaces of the color filters 17 (FIG. 11A).

Moreover, groove portions 32 are formed at predetermined positions according to the layout of sub pixels and pixels by, for example, photolithography and etching, so that the adjacent color filters 17 are separated from each other. Subsequently, the filter protective layer 18 is formed on the first surfaces of the filter top-surface protective film 29. At this point, the filter protective layer 18 is also formed between the adjacent color filters 17 and covers the side portions 28 of the color filter 17. Like the element protective layer 15, the filter protective layer 18 can be formed by, for example, CVD or vapor deposition. Moreover, when the filter protective layer 18 is formed, the cavity portion 12 is formed in the filter protective layer 18 between the adjacent color filters 17. Thus, the display device 10 is obtained.

3. Third Embodiment

Figure 12:
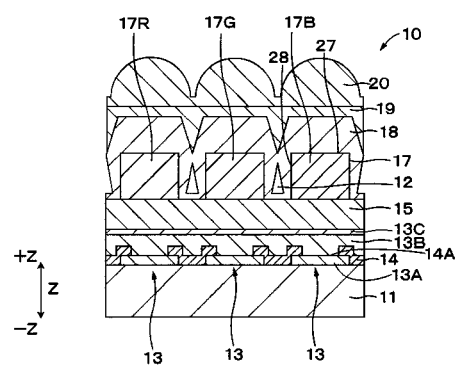
FIG. 12 is a cross-sectional view for explaining a display device according to a modification of a third embodiment.

In the display device according to the first embodiment or the second embodiment, as illustrated in FIG. 12, the flattening layer 19 and the lenses 20 may be stacked on the first surface (top surface) of the filter protective layer 18.
(Flattening Layer)

The flattening layer 19 is provided between the filter protective layer 18 and the lenses 20. The flattening layer 19 forms a flattened surface near the first surface of the filter protective layer 18 and has the function of an adhesive layer that bonds the filter protective layer 18 and the lenses 20. The flattening layer 19 contains, for example, at least one of a thermosetting resin and an ultraviolet curable resin.
(Lens)

The lenses 20 are provided on a surface of the flattening layer 19. In the display device, light having passed through the color filter 17 enters the lens 20, so that the traveling direction of light is adjusted.

The display device according to a third embodiment can be manufactured as follows: first, a method described in the method for manufacturing the display device according to the first embodiment or the second embodiment is performed until the filter protective layer 18 is formed, and then the flattening layer 19 is formed on the first surface of the filter protective layer 18. The flattening layer 19 can be formed over the first surface of the filter protective layer 18 by using, for example, the ODF (One Drop Fill) method.

The lenses 20 are formed on the first surface of the flattening layer 19. The lenses 20 can be formed by applying a method for forming an on-chip microlens (OCL) by using, for example, a melting method or an etch back method. Thus, the display device 10 is obtained.

4 Simulation Example

Figure 13:
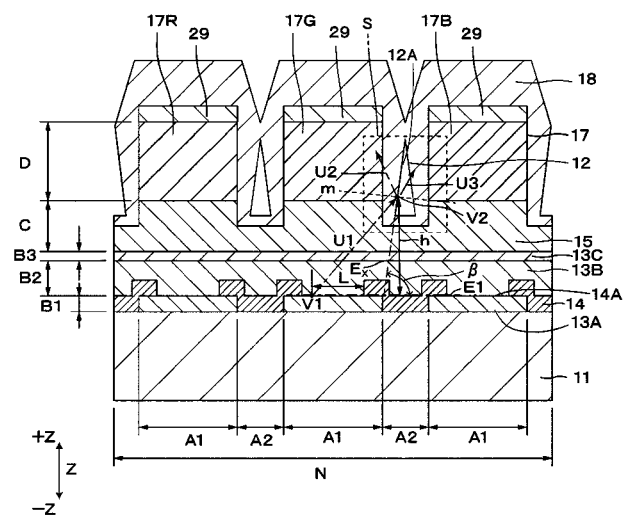
FIG. 13 is a cross-sectional view for explaining a simulation example.
Figure 14:
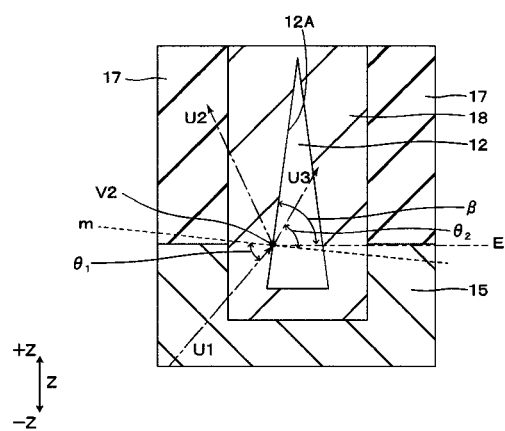
FIG. 14 is a partial enlarged view of a region S surrounded by a broken line in FIG. 13.
Figure 15A:
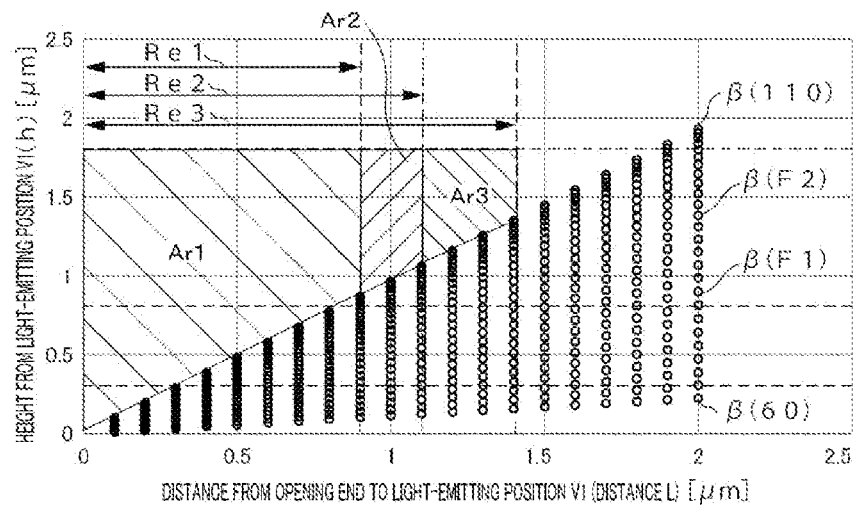
FIGS. 15A and 15B are explanatory drawings of simulation results.
Figure 15B:
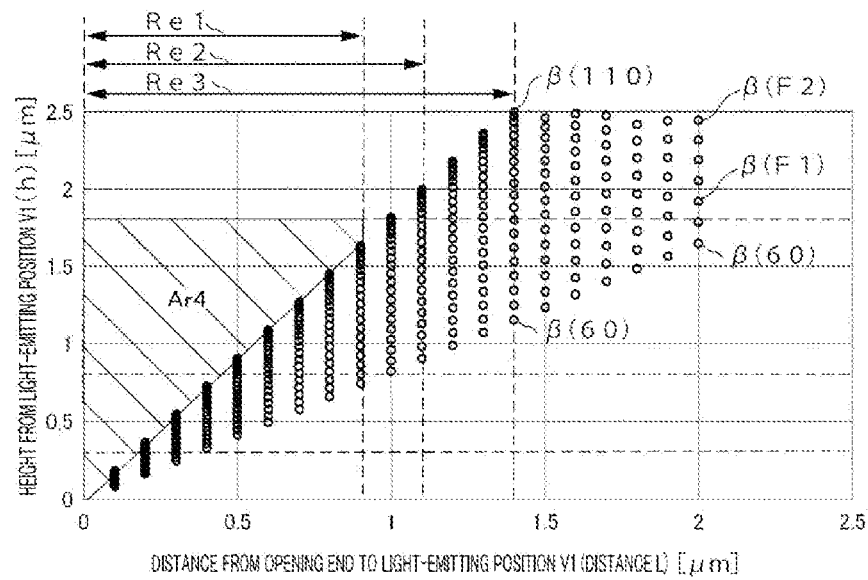

Referring to FIGS. 13, 14, 15A, and 15B, a simulation example will be described for a total reflection position of light on the contact interface between the filter protective layer 18 and the cavity portion 12 in the display device 10. FIGS. 13 and 14 are explanatory drawings of the conditions of simulation for determining a total reflection position on the contact interface in the display device according to the second embodiment. FIGS. 15A and 15B show simulation results.

In the case of the display device 10 illustrated in FIGS. 13 and 14, the conditions for total reflection of light (in FIGS. 13 and 14, light U1 traveling from the filter protective layer 18 to the cavity portion 12) on the contact interface between the filter protective layer 18 and the cavity portion 12 are determined as expressed in formula 1, the light being emitted from a light-emitting position V1 of the organic layer 13B of the light-emitting element 13. In FIGS. 13 and 14, reference numeral V2 denotes an interface reflection position. The interface reflection position V2 indicates a position where the light U1 is like to cause interface reflection on the contact interface between the filter protective layer 18 and the cavity portion 12, and the interface reflection position V2 is specified as a position of intersection of the contact interface between the filter protective layer 18 and the cavity portion 12 and a line extending along the traveling direction of the light U1.

[Math. 1]

$$h \geq L \times \tan(\theta_{max} + \beta - 90°)/(1-(\tan(\theta_{max}+\beta-90°)/\tan \beta)) \quad \text{Formula 1}$$

In formula 1, h is a height (a minimum height where total reflection occurs) to the interface reflection position V2 at the contact interface between the filter protective layer 18 and the cavity portion 12 with reference to the height (a position in the Z-axis direction) of the light-emitting position V1 of the light-emitting element 13 (a height h in FIG. 13). In other words, in FIG. 13, h is a distance (a height from the light-emitting position) from a horizontal plane (indicated by a chain line denoted as E1 in FIG. 13) including the light-emitting position V1 to the interface reflection position V2 along the Z-axis direction. The height direction (+Z direction) for specifying the height h is orthogonal to the horizontal plane E1. L is a distance from the opening end of the openings 14A of the light-emitting element 13 to the light-emitting position V1 (a distance L in FIG. 13). ß is a degree of inclination (the cone angle of the cavity portion 12, a cone angle ß in FIG. 14) of the contact interface (the side wall surface 12A of the cavity portion 12 in FIGS. 13 and 14) between the filter protective layer 18 and the cavity portion 12 with respect to a horizontal plane (indicated by a chain line denoted as E in FIG. 14) including the interface reflection position V2. As indicated in FIG. 13, the cone angle ß also serves as a degree of inclination of the extended plane (indicated by a chain line denoted as reference character Ex in FIG. 13) of the with respect to the horizontal plane E1.

Moreover, $\theta_{max}$ is a critical angle. The critical angle $\theta_{max}$ is the value of an incident angle $\theta_1$ where a refracting angle $\theta_2$ is 90° where $\theta_1$ is the incident angle of the light U1 and $\theta_2$ is the refracting angle of the light U1 with respect to the contact interface. As indicated in FIG. 14, the incident angle $\theta_1$ is an angle formed by a normal m of the contact interface and the light U1 and is equal to an angle formed by the normal m of the contact interface and reflected light U2. Light U3 is refracted light. The total reflection of the light U1 on the contact interface occurs when the incident angle θ1 is equal to or larger than the critical angle $\theta_{max}$. The critical angle $\theta_{max}$ can be calculated on the basis of the refractive index of the filter protective layer 18 and the refractive index of the cavity portion 12.

Regarding the relationship between the distance L and the height h when equality is established in formula 1, a simulation was conducted under the following conditions: The simulation was conducted by determining the value of h when the value of L is changed. Furthermore, the simulation was conducted on condition that the value of ß ranges from 60° to 110° and the cone angle ß is changed at intervals of 2°. The simulation result is indicated in the graph of FIG. 15A with the horizontal axis denoted as L and the vertical axis denoted as h. In FIG. 15A, a cone angle ß of 60° is indicated as ß(60) while a cone angle ß of 60° is indicated as ß(110). Moreover, ß(F1) indicates that a cone angle ß is F1[°] selected from the range of 60° to 110°, and (F2) indicates that a cone angle ß is F2[°] selected from the range of 60° to 110°. It is assumed that the value of F2 is larger than the value of F1. In FIG. 15A, on condition that equality is established in formula 1, the values of the height h at a predetermined cone angle ß and a predetermined distance L are indicated by hollow circles. This also applies to FIG.

15B showing the simulation result of an example in the absence of a cavity portion, which will be described later.

(Simulation Conditions)

(Condition 1)

A pixel pitch of 3.6 µm (length N in FIG. 13)

The light-emitting element with the first electrode measuring 1.0 µm (length A1 in FIG. 13)

A distance of 0.2 µm between the adjacent first electrodes (length A2 in FIG. 13)

The first electrode having a thickness of 0.075 µm (length B1 in FIG. 13)

The organic layer having a thickness of 0.22 µm (length B2 in FIG. 13)

The second electrode having a thickness of 0.06 µm (length B3 in FIG. 13)

The element protective layer having a thickness of 0.5 µm (length C in FIG. 13)

The color filter having a thickness of 1.1 µm (length D in FIG. 13)

(Condition 2)

Condition 2 is identical to condition 1 except for a pixel pitch of 4.2 µm and a distance of 0.4 µm between the adjacent first electrodes.

(Condition 3)

Condition 3 is identical to condition 1 except for a pixel pitch of 5.1 µm and a distance of 0.7 µm between the adjacent first electrodes.

According to the simulation result in FIG. 15A, at a predetermined distance L, the height h has a smaller value at the cone angle ß of (F1) than at the cone angle ß of (F2). In other words, it was confirmed that the minimum height h where total reflection occurs can be reduced as the cone angle ß of the cavity portion 12 of the filter protective layer 18 decreases. Hence, it was confirmed that as the cone angle ß of the cavity portion 12 of the filter protective layer 18 decreases, the range of total reflection on the contact interface increases and light can be extracted with higher efficiency.

In condition 1, the cavity portion 12 is preferably formed such that total reflection is obtained when the light-emitting position V1 is disposed in a range (a range Re1 in FIG. 15A) from the position of 0 µm to the position of 0.9 µm with reference to the opening end. According to the simulation result of FIG. 15A, the range Re1 has a region (a hatched region Ar1 in FIG. 15A) with a combination of a distance L and a height h that satisfy the total reflection condition. Thus, in condition 1, the cavity portion 12 can be designed so as to satisfy the total reflection condition. In condition 2, the cavity portion 12 is preferably formed such that total reflection is obtained when the light-emitting position V1 is disposed in a range (a range Re2 in FIG. 15A) from the position of 0 µm to the position of 1.1 µm with reference to the opening end. According to the simulation result of FIG. 15A, the range Re2 has a region (a combined region of the hatched region Ar1 and a hatched region Ar2 in FIG. 15A) with a combination of a distance L and a height h that satisfy the total reflection condition. Thus, in condition 2, the cavity portion 12 can be designed so as to satisfy the total reflection condition. In condition 3, the cavity portion 12 is preferably formed such that total reflection is obtained when the light-emitting position V1 is disposed in a range (a range Re3 in FIG. 15A) from the position of 0 µm to the position of 1.4 µm with reference to the opening end. According to the simulation result of FIG. 15A, the range Re3 has a region (a combined region of the hatched regions Ar1, Ar2, and Ar3 in FIG. 15A) with a combination of a distance L and a height h that satisfy the total reflection condition. Thus, also in condition 3, the cavity portion 12 can be designed so as to satisfy the total reflection condition. Furthermore, according to the simulation result in FIG. 15A, it was confirmed that even if the pixel pitch decreases, a larger amount of light can be reflected by reducing the height of the cavity portion 12 and light can be extracted with higher efficiency.

As a comparison with the result, it is assumed that the part of the cavity portion 12 is replaced with a solid layer in the display device 10 illustrated in FIGS. 13 and 14 (an example of the absence of a cavity portion). The solid layer is assumed to be a layer of $SiO_2$. In this case, a simulation was conducted on the basis of the conditions 1 to 3. The simulation result if indicated in FIG. 15B.

According to the result of FIG. 15B, in the example of the absence of a cavity portion, if L is likely to have a larger value than that of condition 1 as in conditions 2 and 3 (the range Re2, the range Re3) (a large pixel pitch), the height h may be determined so as not to satisfy the total reflection condition at a lower position than the first surface of the color filter 17. In other words, in the case of the range Re2 and the range Re3, parts may occur out of a region (a region Ar4 in FIG. 15B) with a combination of a distance L and a height h that satisfy the total reflection condition. In contrast, according to the result of FIG. 15A, even if L has a large value in condition 2 and condition 3, the formation of the cavity portion 12 can determine a height h satisfying the total reflection condition at a lower position than the first surface of the color filter.

As described above, the comparison between the simulation result in FIG. 15A and the simulation result in FIG. 15B proved that the formation of the cavity portion 12 in the filter protective layer 18 facilitates total reflection on the contact interface as compared with the formation of a solid layer.

5 Application Example (Electronic Device)

The display device 10 according to the foregoing embodiment and modifications may be provided for various electronic devices. In particular, the display device 10 is preferably provided for electronic devices such as an electronic viewfinder of a video camera or a single-lens reflex camera or a head-mounted display, which require a high resolution and are used under magnification near eyes.

Specific Example 1

Figure 16A:
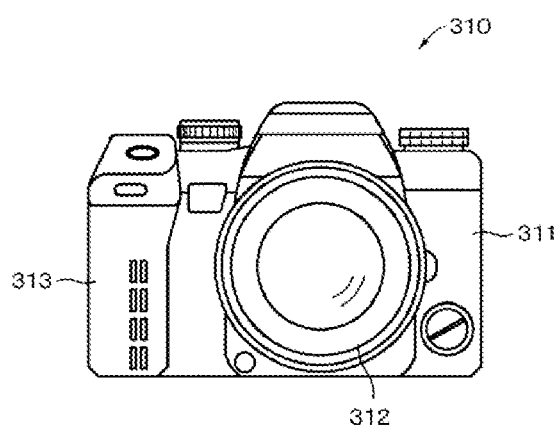
FIGS. 16A and 16B are explanatory drawings of an example of an electronic device in which the display device is used.
Figure 16B:
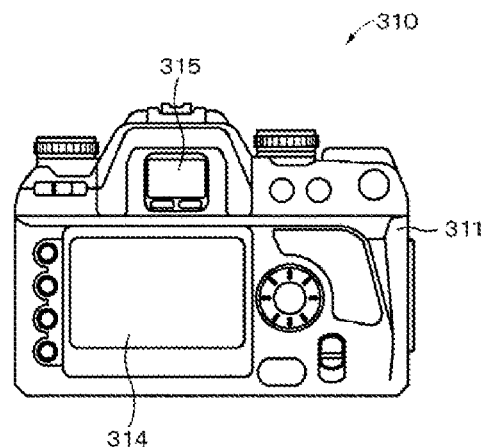

FIG. 16A is a front view illustrating an example of the appearance of a digital still camera 310. FIG. 16B is a rear view illustrating an example of the appearance of the digital still camera 310. The digital still camera 310 is an interchangeable single-lens reflex-type camera that has an interchangeable photographing lens unit (interchangeable lens) 312 substantially at the center of the front side of a camera main unit (camera body) 311 and has a grip portion 313 to be held by a photographer on the left side of the front side.

A monitor 314 is provided at a position shifted to the left from the center of the rear side of the camera main unit 311. On the monitor 314, an electronic viewfinder (eyepiece window) 315 is provided. Viewing through the electronic viewfinder 315 allows the photographer to visually recognize an optical subject image guided from the photographing lens unit 312 and determine the composition. The electronic viewfinder 315 may be any one of the display devices 10 according to the foregoing embodiment and modifications.

Specific Example 2

Figure 17:
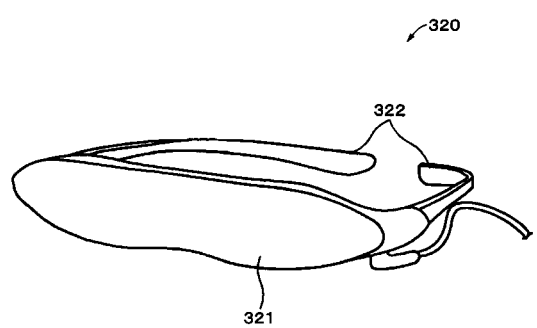
FIG. 17 is an explanatory drawing of an example of the electronic device in which the display device is used.

FIG. 17 is a perspective view illustrating an example of the appearance of a head-mounted display 320. The head-mounted display 320 has, for example, ear hooks 322 to be worn on the head of a user. The ear hooks 322 are provided on both sides of an eyeglass-shaped display unit 321. The display unit 321 may be any one of the display devices 10 according to the foregoing embodiment and modifications.

Specific Example 3

Figure 18:
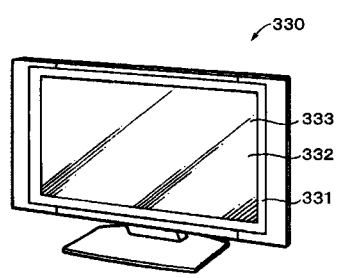
FIG. 18 is an explanatory drawing of an example of the electronic device in which the display device is used.

FIG. 18 is a perspective view illustrating an example of the appearance of a television set 330. The television set 330 has, for example, an image display screen part 331 including a front panel 332 and a filter glass 333. The image display screen part 331 is configured with any one of the display devices 10 according to the foregoing embodiment and modifications.

The first to third embodiments of the present disclosure and modifications thereof have been specifically described above. The present disclosure is not limited to the first to third embodiments and modifications, and various modifications based on the technical idea of the present disclosure can be made.

For example, the configurations, methods, processes, shapes, materials, numerical values, and the like given in the first to third embodiments and modifications are merely exemplary, and different configurations, methods, processes, shapes, materials, numerical values, and the like may be optionally used.

The configurations, methods, processes, shapes, materials, numerical values, and the like in the first to third embodiments and modifications can be combined without departing from the gist of the present disclosure.

Unless otherwise specified, one of the materials exemplified in first to third embodiments and modifications thereof may be used alone or two or more of the materials may be used in combination.

In addition, the present disclosure may be configured as follows:

(1) A display device including: a plurality of light-emitting elements having an organic layer;
 a plurality of color filters disposed at positions corresponding to the respective light-emitting elements; and
 a filter protective layer covering the side portions of the plurality of the color filters, wherein at a position between the adjacent color filters, a cavity portion is formed in the filter protective layer.

(2) The display device according to (1), wherein the cavity portion has a lower end disposed lower than the color filter and higher than the light-emitting element when a direction from the color filter to the light-emitting element along the thickness direction of the color filter is denoted as a downward direction.

(3) The display device according to (1), wherein the cavity portion has a lower end disposed between the adjacent light-emitting elements when a direction from the color filter to the light-emitting element along the thickness direction of the color filter is denoted as a downward direction.

(4) The display device according to (1), wherein the cavity portion has a lower end disposed lower than a position between the adjacent light-emitting elements when a direction from the color filter to the light-emitting element along the thickness direction of the color filter is denoted as a downward direction.

(5) The display device according to any one of (1) to (4), wherein the cavity portion is formed in one of a forward-tapered shape, a non-tapered shape, and a reversely tapered shape in cross section.

(6) The display device according to any one of (1) to (5), wherein the filter protective layer has a refractive index equal to or lower than a refractive index of the color filter.

(7) The display device according to any one of (1) to (6), further including an element protective layer covering the light-emitting elements,
 wherein the element protective layer has a step portion formed on the top surface of the element protective layer, and
 a side portion of the step portion and the side portion of the color filter are displaced from each other.

(8) The display device according to any one of (1) to (7), further including the element protective layer covering the light-emitting elements,
 wherein the filter protective layer has a refractive index equal to or lower than a refractive index of the element protective layer.

(9) The display device according to any one of (1) to (8), wherein a ratio of a height of the color filter to an interval between the adjacent color filters is at least 1.

(10) The display device according to any one of (1) to (9), wherein the filter protective layer further covers the top surface sides of the color filters, and the filter protective layer has a flat surface or convex and concave surfaces including convex portions that are trapezoidal or dome-shaped.

(11) The display device according to (1) to (9), further including a flattening layer and a lens that are formed in this order on the top surface of the filter protective layer.

(12) The display device according to any one of (1) to (11), further including a filter top-surface protective film formed between the top surface of the color filter and the filter protective layer.

(13) The display device according to any one of (1) to (12), wherein the plurality of the color filters are disposed in one of a square array, a delta array, and a stripe array.

(14) The display device according to any one of (1) to (13), wherein a luminescent color of the organic layer is any one of white, red, blue, and green.

(15) An electronic device including the display device according to any one of (1) to (14).

REFERENCE SIGNS LIST

10 Display device
11 Substrate
12 Cavity portion
13A First electrode
13B Organic layer
13C Second electrode
14 Insulating layer
15 Element protective layer
17 Color filter
18 Filter protective layer
19 Flattening layer
20 Lens
21 Step portion
21A Upper surface
21B Side portion
27 Top surface portion
28 Side portion
31, 32 Groove portion
310 Digital still camera
320 Head-mounted display
330 Television set

The invention claimed is:

1. A display device, comprising:
a plurality of light-emitting elements having an organic layer;
a plurality of color filters that is at positions corresponding to the plurality of light-emitting elements;
a filter protective layer that covers side portions of the plurality of the color filters; and
a cavity portion that is in the filter protective layer, wherein
the cavity portion is at a specific position between adjacent color filters of the plurality of color filters,
a direction from the plurality of color filters to the plurality of light-emitting elements along a thickness direction of the plurality of color filters is denoted as a downward direction,
a lower end of the cavity portion is below lower ends of the adjacent color filters in the downward direction,
the lower end of the cavity portion is above the plurality of light-emitting elements in the downward direction.

2. The display device according to claim 1, wherein
the cavity portion is in one of a forward-tapered shape, a non-tapered shape, or a reversely tapered shape in cross section.

3. The display device according to claim 1, wherein
the filter protective layer has a refractive index equal to or lower than a refractive index of the plurality of color filters.

4. The display device according to claim 1, further comprising
an element protective layer that covers the plurality of light-emitting elements, wherein
the element protective layer has a step portion on a top surface of the element protective layer, and
a side portion of the step portion is displaced with respect to a side portion of a color filter of the plurality of color filters.

5. The display device according to claim 1, further comprising
an element protective layer that covers the plurality of light-emitting elements, wherein
the filter protective layer has a refractive index equal to or lower than a refractive index of the element protective layer.

6. The display device according to claim 1, wherein
a ratio of a height of the plurality of color filters to an interval between the adjacent color filters is at least 1.

7. The display device according to claim 1, wherein
the filter protective layer further covers top surface sides of the plurality of color filters,
the filter protective layer has one of:
a flat surface,
a convex surface including convex portions that are one of a trapezoidal shaped or a dome-shaped, or
a concave surface.

8. The display device according to claim 1, further comprising
a flattening layer on a top surface of the filter protective layer; and
a plurality of lenses on the flattening layer.

9. The display device according to claim 1, further comprising
a filter top-surface protective film between a top surface of the plurality of color filters and the filter protective layer.

10. The display device according to claim 1, wherein the plurality of the color filters are in one of a square array, a delta array, or a stripe array.

11. The display device according to claim 1, wherein a luminescent color of the organic layer is one of a white color, a red color, a blue color, or a green color.

12. An electronic device, comprising the display device according to claim 1.

13. A display device, comprising:
a plurality of light-emitting elements having an organic layer;
a plurality of color filters that is at positions corresponding to the plurality of light-emitting elements;
a filter protective layer that covers side portions of the plurality of the color filters; and
a cavity portion that is in the filter protective layer, wherein
the cavity portion is at a specific position between adjacent color filters of the plurality of color filters,
a direction from the plurality of color filters to the plurality of light-emitting elements along a thickness direction of the plurality of color filters is denoted as a downward direction,
a lower end of the cavity portion is at a position between adjacent light-emitting elements of the plurality of light-emitting elements, and
the lower end of the cavity portion is below lower ends of the adjacent light-emitting elements in the downward direction.

14. A display device, comprising:
a plurality of light-emitting elements having an organic layer;
a plurality of color filters that is at positions corresponding to the plurality of light-emitting elements;
a filter protective layer that covers side portions of the plurality of the color filters;
a cavity portion that is in the filter protective layer, wherein the cavity portion is at a specific position between adjacent color filters of the plurality of color filters; and
a filter top-surface protective film between a top surface side of the plurality of color filters and the filter protective layer.

* * * * *